United States Patent

Ohtani

Patent Number: 6,093,587
Date of Patent: Jul. 25, 2000

[54] CRYSTALLIZATION OF AMORPHOUS SILICON FILM USING A METAL CATALYST

[75] Inventor: Hisashi Ohtani, Kanagawa, Japan

[73] Assignee: Semiconductor Energy Laboratory Co., Ltd., Kanagawa-ken, Japan

[21] Appl. No.: 09/026,888

[22] Filed: Feb. 19, 1998

[30] Foreign Application Priority Data

Feb. 20, 1997 [JP] Japan .................................. 9-053843

[51] Int. Cl.[7] ............................. H01L 21/00; H01L 21/84
[52] U.S. Cl. ........................ 438/166; 438/486; 438/149; 148/DIG. 16
[58] Field of Search .................................. 438/163, 164, 438/166, 149, 308, 482, 486, 903; 148/DIG. 16, DIG. 150

[56] References Cited

U.S. PATENT DOCUMENTS

| | | | |
|---|---|---|---|
| 4,975,387 | 12/1990 | Prokes et al. | 438/486 |
| 5,508,533 | 4/1996 | Takemura | 257/64 |
| 5,550,070 | 8/1996 | Funai et al. | 438/486 |
| 5,712,191 | 1/1998 | Nakajima et al | 438/487 |
| 5,869,362 | 2/1999 | Ohtani | 438/166 |
| 5,882,960 | 3/1999 | Zhang et al. | 438/166 |
| 5,915,174 | 6/1999 | Yamazaki et al. | 438/166 |
| 6,013,544 | 1/2000 | Makita et al. | 438/166 |

*Primary Examiner*—Carl Whitehead, Jr.
*Assistant Examiner*—Jamie L. Davis
*Attorney, Agent, or Firm*—Fish & Richardson P.C.

[57] ABSTRACT

A method of manufacturing a crystalline silicon film excellent in crystallinity. When using elements such as nickel as metal elements that promotes the crystallization of the amorphous silicon film, nickel is allowed to be contained in a solution repelled by the surface of the amorphous silicon film. Then, a part of the amorphous silicon film is removed, and the solution is held in only that part. In this way, the nickel elements are selectively introduced into a part of the amorphous silicon film, and a heat treatment is also conducted to allow crystal growth to proceed from that portion toward a direction parallel to a substrate.

21 Claims, 6 Drawing Sheets

CRYSTALLIZATION OF AMORPHOUS SILICON FILM USING A METAL CATALYST

BACKGROUND OF THE INVENTION

1. Field of the Invention

The present invention relates to a method of manufacturing a semiconductor device using semiconductor with crystallinity.

2. Description of the Related Art

There has been known a thin film transistor (hereinafter referred to as "TFT") using thin film semiconductor. The TFT is made up of thin film semiconductor formed on a substrate. The TFT is used in a variety of integrated circuits, and in particular, attention is paid to the TFT as a switching device disposed in each pixel and a driver device formed on a peripheral circuit section in an active matrix-type liquid-crystal display device.

Up to now, an amorphous silicon film has been employed as a thin film semiconductor for use in a TFT, but in order to obtain higher performance, an attempt has been made to use a silicon film (crystalline silicon film) having crystallinity.

The TFT using the crystalline silicon film enables higher speed operation than that using the amorphous silicon film by two digits or more, and enables the manufacturing peripheral drive circuit of the liquid crystal display device which has been formed of an external IC, on a substrate on which an active matrix circuit is also formed.

The conventional crystalline silicon film is obtained by crystallizing an amorphous silicon film formed through a plasma CVD method or a low pressure CVD method, by a heat treatment or the irradiation of a laser light.

However, the method of crystallizing the amorphous silicon film by heating suffers from the following problems although it has an advantage that the crystalline silicon thin film can be obtained over a large area.

(1) A high heating temperature is required (it is difficult to use a glass substrate).

(2) The obtainable crystallinity is insufficient.

On the other hand, the method of crystallizing the amorphous silicon film by the irradiation of a laser light suffers from a problem that high productivity and large-area processing are difficult although it has superiority that a glass substrate can be used as the substrate.

Under the above-described circumstances, the present inventors have developed a technique in which metal elements that promote the crystallization such as nickel, palladium, lead or the like are added to the amorphous silicon film to obtain the crystalline silicon film through a heat treatment conducted at a lower temperature than the conventional one (refer to Japanese Patent Unexamined Publication No. Hei 7-130652).

This method not only enables a crystallizing rate to increase so that crystallization can be achieved in a short time, but also enables high crystallinity to be uniformly obtained over a large area in comparison with the conventional method of crystallizing the amorphous silicon film by only heating or the crystallization of the amorphous silicon film by means of only the irradiation of a laser light.

The above-described crystallizing method using the metal elements will be roughly described hereinafter. First, as shown in FIG. 5A, a silicon oxide film 502 is formed on a glass substrate 501 as an under film, and an amorphous silicon film 503 is then formed on the silicon oxide film 502.

Subsequently, UV rays are applied to the amorphous silicon film 503 in an oxygen atmosphere to form an extremely thin oxide film on a surface of the amorphous silicon film. This is for preventing a solution containing nickel which will be introduced therein later from being repelled by the surface of the amorphous silicon film.

Thereafter, a mask 504 made of the silicon oxide film is formed. Then, an opening 505 is then defined in the mask 504. Further, a solution containing nickel therein is coated on the surface, and a excessive solution is blown off by a spin coater, to thereby obtain a state where a small amount of solution is held as indicated by reference numeral 506 (FIG. 5B).

Sequentially, a heat treatment is conducted to make crystal growth in parallel with a substrate indicated by reference numeral 508.

In this process, the growth is hindered by the mask 504 made of the silicon oxide film.

It is presumed that this is caused by a stress exerted between the mask 504 and the silicon film, but its details are not clear.

In order to prevent this problem, it is proposed that after the state shown in FIG. 5B, the mask 504 is removed to conduct a heat treatment. However, in this case, nickel is also removed together, which will adversely affect crystallization to be conducted later.

SUMMARY OF THE INVENTION

The present invention has been made in order to solve the above-described problems, and therefore an object of the present invention is to provide a technique of removing hindrance to crystal growth made in parallel to the above-described substrate.

In order to achieve the above-described object, according to one aspect of the present invention, there is provided a method of manufacturing a semiconductor device, comprising the steps of:

removing a part of an amorphous silicon film formed on a substrate having an insulating surface to form a region for introducing metal elements that promote crystallization of silicon;

allowing the region for adding said metal elements to selectively hold said metal elements; and conducting a heat treatment to allow crystal growth from said metal element added region toward a direction in parallel to the substrate.

Also, in the above method, the introduction of said metal elements is conducted by coating a solution containing metal elements therein, and the selective holding of said metal elements is conducted by using water repellency of the silicon film to said solution.

Further, in the above method, in crystal growth, a surface of a region where crystal growth is conducted is exposed.

Also, according to another aspect of the present invention, there is provided a method of introducing metal elements that promote the crystallization of silicon from a surface of an amorphous silicon film, comprising the step of:

selectively controlling hydrophobic property of the surface of the amorphous silicon film to positionally control an introduced amount of said metal elements.

In this method, with positional control of the hydrophobic property of the surface of the amorphous silicon film, the metal elements are selectively introduced.

For example, an oxide film is formed on a part of the amorphous silicon film with the result that the wettability of that region is improved. Then, the solution containing the metal elements therein is coated on the surface in that state so that the metal elements can be introduced in only that region, or an introduced amount of the metal elements can be increased only in that region.

The most preferable metal elements that promote the crystallization of silicon is Ni from the viewpoint of the effect and reproducibility.

Also, the metal elements to be used may be one or plural kinds of elements selected from Fe, Co, Ni, Ru, Rh, Pd, Os, Ir, Pt, Cu and Au.

As a starting film, an amorphous film which is made of a silicon compound may be used instead of the amorphous silicon film. For example, an amorphous film indicated by $Si_xGe_{1-x}$ (0<x<1) may be used.

DETAILED DESCRIPTION OF THE EMBODIMENTS

Figure 2A:
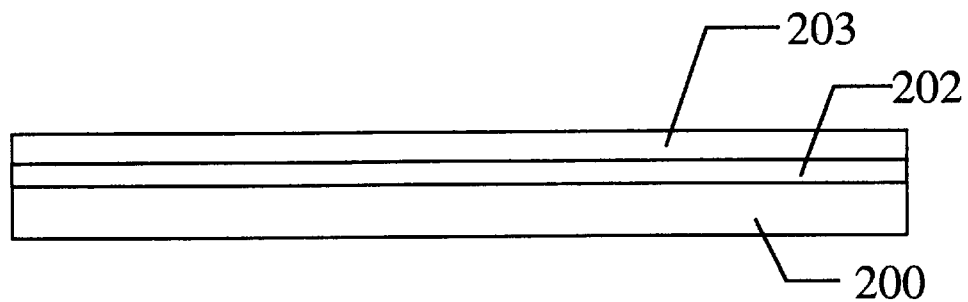
FIGS. 2A to 2D are diagrams showing a process of manufacturing a thin film transistor of the first embodiment.

First, an amorphous silicon film 203 is formed (FIG. 2A).

Figure 2B:
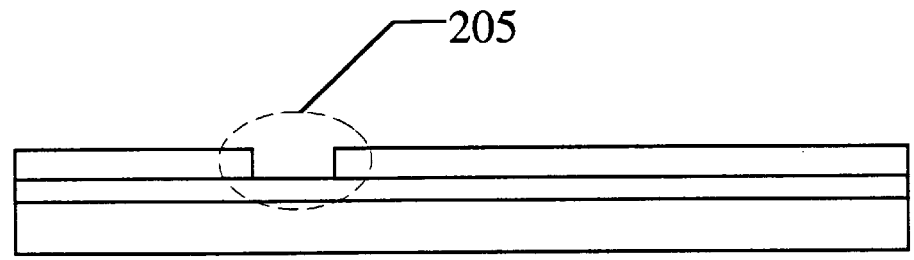

Then, a part of the amorphous silicon film 203 is removed to form a region into which metal elements indicated by reference numeral 205 are introduced (FIG. 2B).

Subsequently, a solution (for example, nickel acetate solution) containing nickel elements therein which exhibits a water repellency (hydrophobic property) is coated on an entire surface of the amorphous silicon film 203.

Generally speaking, the amount of the metal elements contained in the solution is desirably set so as to be 1 ppm to 200 ppm, preferably 1 ppm to 50 ppm (weight conversion) with respect to the solution when the metal elements are nickel, although it depends on the kind of solution. This is a value determined in view of the concentration of nickel and a hydrofluoric acid resistivity in the film after the completion of crystallization.

In a state shown in FIG. 2B, the solution as coated is repelled by the surface of the amorphous silicon film.

Figure 2C:
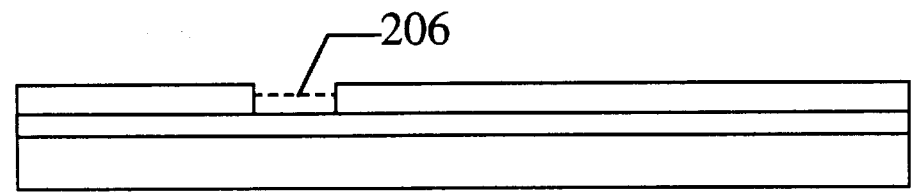

As a result, the solution exists in only the region where a part of the amorphous silicon film has been removed (in this region, an under film 202 is exposed), as shown in FIG. 2C.

Figure 1A:
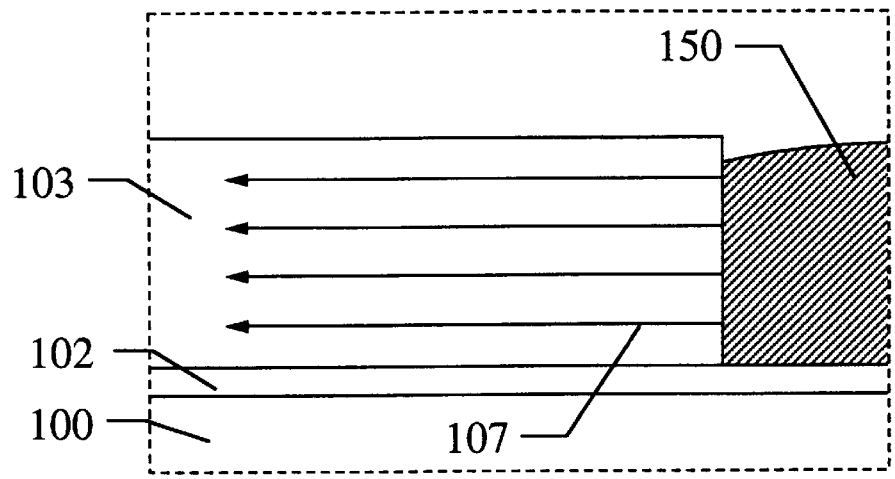
FIGS. 1A to 1C are cross-sectional views each showing the vicinity of an opening into which metal elements are added at the time of crystallization according to the present invention.

In this state, as shown in FIG. 1A, a solution 150 exists on a side surface of the amorphous silicon film 103. In this example, reference numeral 100 denotes a glass substrate, and 102 is a silicon oxide film which denotes an under layer.

Figure 2D:
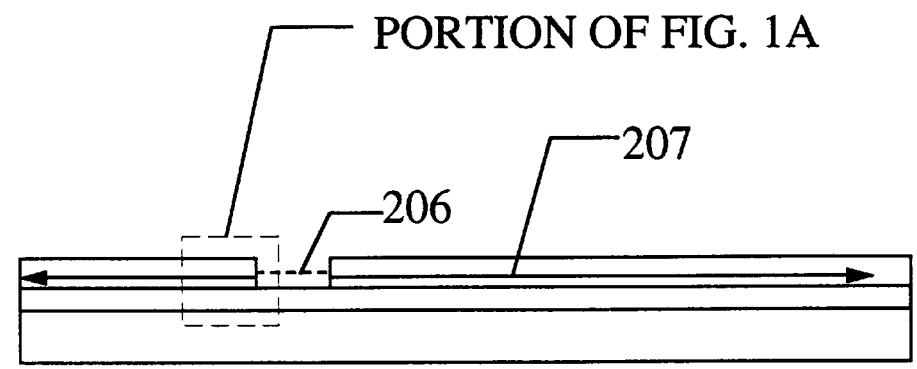

With a heat treatment in this state, the nickel elements are diffused so that crystal growth proceeds in a direction parallel to the substrate as indicated by reference numeral 107 (207 in case of FIG. 2) (FIGS. 1A and 2D).

In this crystal growth, since nothing is formed on the surface of the silicon film (at least an artificial film formation or processing is not conducted), crystal growth proceeds smoothly.

It is preferable that a temperature at which the above-described heat treatment is conducted for crystallization is selected from a range of 550 to 650° C.

This is because when the temperature is lower than 550° C., crystallization does not proceed, whereas when the temperature is higher than 650° C., crystallization not caused by the action of nickel proceeds to impede the crystallization caused by the action of nickel.

A configuration as indicated by reference numeral 205 in FIG. 2B (dimensions such as a length, a depth and a width) obtained by removing a part of the amorphous silicon film is important in controlling the crystallinity of the silicon film and the amount of metal elements.

Also, in a process shown in FIGS. 2A to 2D, it is important to prevent the amorphous silicon film 203 from being oxidized and prevent another film from being laminated on the amorphous silicon film 203 prior to the processes shown in FIGS. 1A and 2B.

Figure 1B:
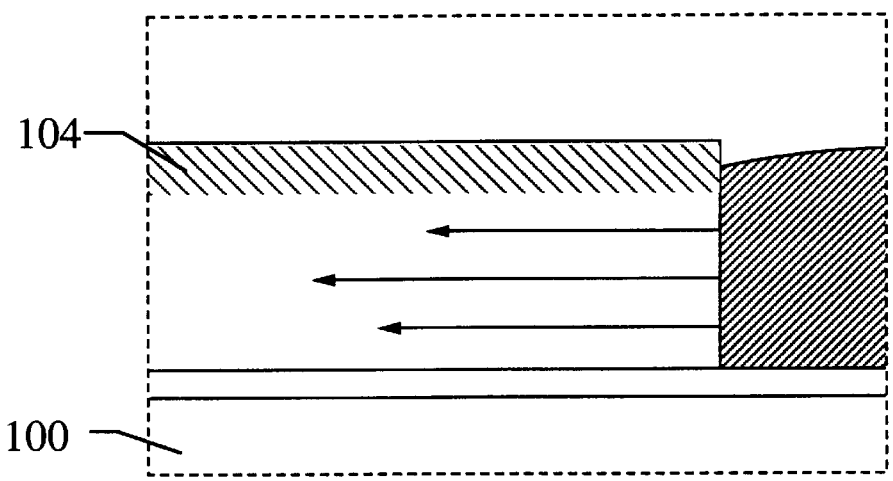

As shown in FIG. 1B, in the case where the amorphous silicon film 103 is oxidized to form the silicon oxide film 104, because a sufficient water repellency (hydrophobic property) is not obtained by the silicon oxide film, the solution remains on the upper surface of the amorphous silicon film, thereby making it difficult to hold the metal elements in only the metal element added region.

Further, in the case where the crystallizing process which is a subsequent process is conducted, as shown in FIG. 1B, crystallization is impeded by an influence of an interface between the oxide film and the amorphous silicon film, thereby being not capable of obtaining an excellent crystallinity.

Figure 1C:
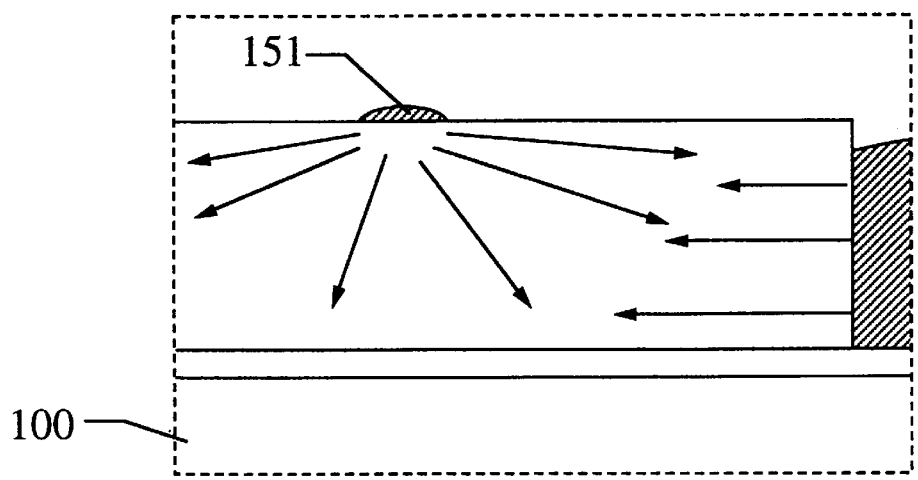

Also, as shown in FIG. 1C, crystal growth proceeds from an unintended region 151 on the amorphous surface, to thereby come to a state where crystal growth proceeding from a specified region toward a direction parallel to the substrate is impeded, because, when crystal growth collides with crystal growth proceeding from a different region, grain boundaries are formed there to stop crystal growth.

For the above reasons, it is desirable that stains on the surface of the amorphous silicon film and a natural oxide film are removed by a hydrofluoric acid processing or the like before coating the solution containing the metal elements therein on the amorphous silicon film to thereby form a silicon film surface having a sufficient water repellency.

Also, it is preferable that the solution is coated on the amorphous silicon film without allowing the amorphous silicon film to be in contact with an oxidizing atmosphere (for example, air) after the stains on the surface of the amorphous silicon film and the natural oxide film are removed by the hydrofluoric acid processing, etc., and then a heat treatment is conducted.

First Embodiment

FIGS. 2A to 4K show a process of manufacturing a thin film transistor according to a first embodiment.

First, a silicon oxide film is formed in thickness of 30 nm Å as an under film 202 on a quartz substrate 200. If the smoothness of the surface of the silica substrate is excellent, and the surface is sufficiently cleaned, the under film 202 is not particularly required.

Also, although the quartz substrate is used as an insulating substrate, a glass substrate, a single crystal silicon substrate or a polycrystal silicon substrate on a surface of which an insulating film is formed may be employed instead of the quartz substrate.

Subsequently, an amorphous silicon film 203 that serves as a starting film of the crystalline silicon film is formed in a thickness of 60 nm through the low pressure CVD method (FIG. 2A).

It is preferable that the thickness of the amorphous silicon film is set to 200 nm or less.

Then, an opening indicated by reference numeral 205 is defined on the amorphous silicon film. The opening 205 has a slender rectangular which is longitudinal along a backward direction and a forward direction of the figure. The width of the opening 205 is properly set to be 10 μm or more. Also, an end portion of the opening 205 is designed so as to be apart from an island region of an active layer which will be formed in a later process.

In the opening, the silicon oxide film 202 which is an under film is exposed.

Then, the stains on the surface of the amorphous silicon film and a natural oxide film are removed by a hydrofluoric acid processing or the like.

Thereafter, a nickel acetate solution containing nickel elements of 10 ppm in weight conversion therein is coated on the surface. Then, spin dry is conducted using a spinner (not shown) to remove an excessive solution existing on the upper surface of the amorphous silicon film.

The nickel acetate solution has a sufficient water repellency to the amorphous silicon film. In this way, there is obtained a state in which the nickel elements exist in a state indicated by a dotted line 206 in FIG. 2C.

In this state, the nickel acetate solution is repelled by the surface of the amorphous silicon film in a region other than the opening 205. Then, there is obtained a state in which the nickel elements are selectively held in contact with a part of the amorphous silicon film on a side wall of the opening 205.

Thereafter, a heat treatment is conducted at 600° C. for 8 hours in a nitrogen atmosphere containing 3% of hydrogen but oxygen as little as possible. With this process, as indicated by reference numeral 207 in FIG. 2D, crystal growth proceeds in a direction parallel to the substrate 200.

The crystal growth proceeds from the region of the opening 205 into which the nickel elements are introduced (a metal element added opening) toward a direction parallel to the substrate.

The surface of the crystalline silicon film that has laterally grown as obtained by this crystal growth is very excellent in smoothness in comparison with the conventional low-temperature polysilicon or high-temperature polysilicon. It is presumed that this is because directions along which grain boundaries extend are roughly uniform.

The silicon film which is called generally polycrystal silicon or polysilicon has a surface roughness of ±10 nm or more. However, in the case of allowing lateral growth as described in this embodiment, it is observed that the surface roughness is ±3 nm or less. The roughness deteriorates the characteristics of the interface between the silicon film and the gate insulating film, and therefore the roughness is preferably made as small as possible.

In the heat treatment condition for the above-described crystallization, the lateral growth can be conducted over 100 μm or more.

After the state shown in FIG. 2D is obtained, a laser light may be irradiated thereonto. In other words, the crystallization may be further promoted by the irradiation of a laser light. The irradiation of the laser light has the effect of diffusing a mass of nickel elements existing in the film so that the nickel elements are liable to be removed later. Even if the laser light is irradiated thereon at this stage, the lateral growth does not further proceed.

The laser light to be used may be an excimer laser having the wavelengths of an ultraviolet region. For example, KrF excimer laser (248 nm in wavelength) or XeCl excimer laser (308 nm in wavelength) can be employed.

Thereafter, a heat treatment is conducted at 950° C. in an oxygen atmosphere containing halogen elements, for example, an oxygen atmosphere containing HCl of 3 vol % therein, to form a thermal oxide film in a thickness of 200 Å (not shown). The thickness of the silicon film is reduced about 100 Å according to the formation of the thermal oxide film. That is, the thickness of the silicon film is set to be about 500 Å.

In this process, the silicon elements having an unstable bonding state in the film are utilized for the formation of the thermal oxide film when the thermal oxide film is formed. Then, defects in the film are reduced, thereby being capable of obtaining higher crystallinity.

Also, the gettering of the nickel elements in the film is conducted due to the formation of the thermal oxide film and the action of chlorine.

After the formation of the thermal oxide film, the thermal oxide film (not shown) is removed. In this way, a crystalline silicon film in which the content concentration of the nickel elements is reduced, is obtained. The crystalline silicon film thus obtained has a structure in which crystal structures extend in one direction (this direction is identical with the crystal growth direction). That is, the crystalline silicon film has a structure in which a plurality of slender columnar crystals are aligned in parallel through a plurality of grain boundaries that extend in one direction.

Figure 3E:
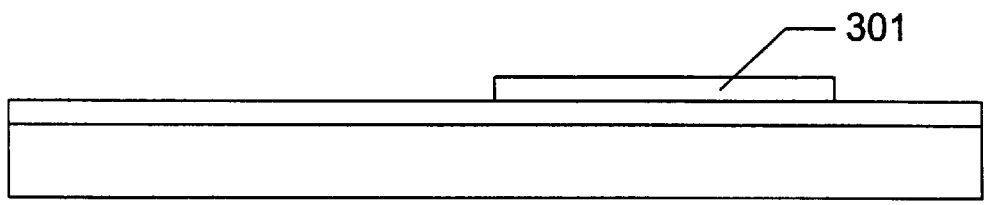
FIGS. 3E to 3H are diagrams showing a process of manufacturing a thin film transistor of the first embodiment.

Thereafter, patterning is conducted to form a pattern of a lateral growth region. An island region 301 of this region will form an active layer of a TFT later (FIG. 3E).

In this process, the island region 301 is positioned in such a manner that a direction connecting a source region and a drain region is identical or substantially identical with the crystal growth direction. This enables a direction along which carriers move to be identical with a direction along which crystal lattices continuously extend, with the result that a TFT having a high-characteristic can be obtained.

Figure 3F:
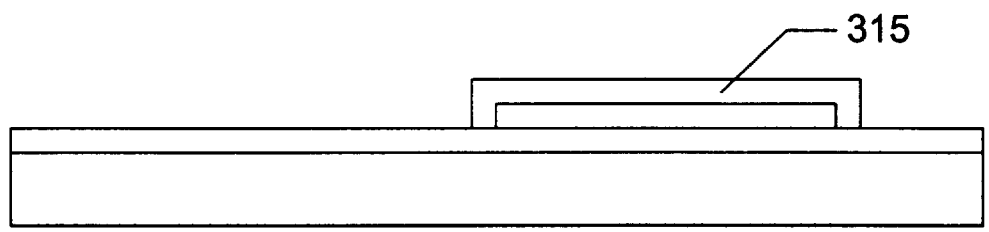
Figure 3G:
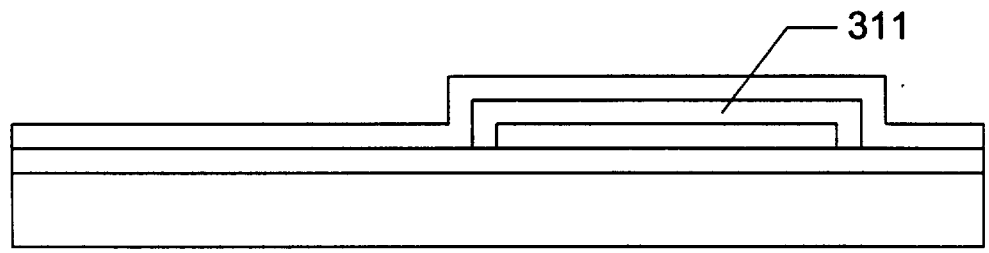

After the formation of the island region 301, a silicon oxide film 315 is formed in a thickness of 500 Å through the plasma CVD method. Because no mask is formed on a surface, the silicon oxide film 315 should be formed over the entire surface of the under film 202 and the island region 301. (FIG. 3F).

Then, Because no mask is formed on a surface, the silicon oxide film 315 should be formed over the entire surface of the under film 202 and the island region 301.

Then, a thermal oxide film 311 is formed in a thickness of 300 Å through the thermal oxidation method.

The formation of the thermal oxide film 311 having a thickness of 300 Å makes the surface of the island region 301 reduce to the thickness of 150 Å. Accordingly, the thermal oxide film 311 is formed using part of the silicon island 301, so that it is apparent that the thermal oxide film 311 is formed between the silicon island 301 and the silicon oxide film formed through the plasma CVD method.

Thereafter, an aluminum film for forming a gate electrode is formed in a thickness of 4,000 Å through the sputtering method. 0.2 wt % of scandium is allowed to be contained in the aluminum film.

The reason why scandium is allowed to be contained in the aluminum film is to suppress hillock or whisker from occurring in a later process. The hillock or whisker is directed to a needle-shaped or sharp projection caused by abnormal growth of aluminum at the time of heating.

A material for forming the gate electrode may be tantalum (Ta), polycrystal silicon doped with phosphorus (P) with a high concentration, silicide of tungsten (WSi), or a structure in which polycrystal silicon doped with phosphorus and silicide of tungsten are laminated or hybridized, other than aluminum.

After the formation of the aluminum film, a dense anodic oxide film (not shown) is formed. The anodic oxide film is formed under the condition where an electrolyte is an ethylene glycol solution containing 3% of tartaric acid, an anode is formed of an aluminum film and a cathode is made of platinum. In this process, the anodic oxide film having a dense film quality is formed in a thickness of 100 Å on the aluminum film.

The anodic oxide film not shown serves to improve the adhesion to a resist mask 322 which will be formed later.

The thickness of the anodic oxide film can be controlled by applied voltage at the time of anodic oxidation.

Figure 3H:
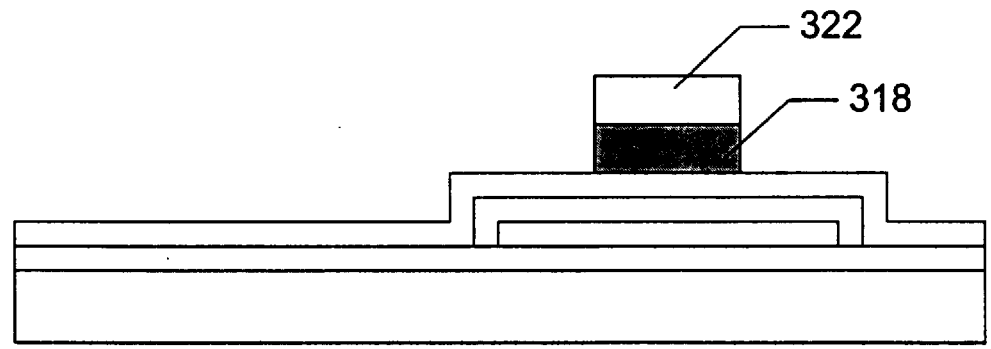

Then, a resist mask is formed. Using this resist mask, the aluminum film is patterned to a pattern 318. Thus, a state shown in FIG. 3H is obtained.

In this situation, anodic oxidation is again conducted. In this process, a 3% of oxalic acid aqueous solution is used as the electrolyte. In this electrolyte solution, anodic oxidation is conducted with the pattern 318 of aluminum as an anode, to thereby form a porous anodic oxide film.

Figure 4I:
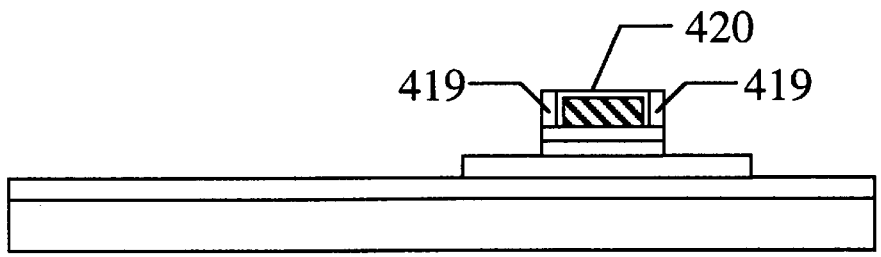
FIGS. 4I to 4K are diagrams showing a process of manufacturing a thin film transistor of the first embodiment.

In this process, porous anodic oxide films 419 are selectively formed on a side surface of the aluminum pattern because a high-adhesive resist mask 322 exists on the upper portion. (FIG. 4)

The porous anodic oxide films 419 can be allowed to grow up to the thickness of several μm. In this embodiment, the thickness is set to be 6,000 Å. The growth distance can be controlled according to an anodic oxidation time.

Then, the resist mask 322 is removed. Subsequently, a dense anodic oxide film 420 is again formed. In other words, anodic oxidation is again conducted with the above-mentioned, ethylene glycol solution containing 3% of tartaric acid as the electrolyte.

In this process, a dense-quality anodic oxide film is formed as indicated by reference numeral 420 because the electrolyte enters the porous anodic oxide films 419.

The thickness of the dense anodic oxide film 420 is set to be 1,000 Å. The thickness is controlled by applied voltage.

In this situation, the exposed silicon oxide film 315 is etched. Also, the gate insulating film formed of the CVD silicon oxide film 315 and the thermal oxide film 311 is etched. The etching is made by dry etching.

Figure 4J:
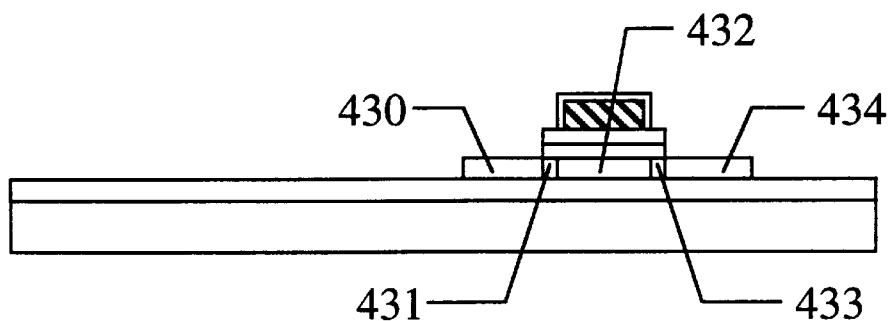

In this way, a state shown in FIG. 4J is obtained. Then, using a mixture acid in which acetic acid, nitric acid and phosphoric acid are mixed together, the porous anodic oxide films 419 are removed.

After the state shown in FIG. 4J is obtained, impurity ions are implanted. In this embodiment, in order to manufacture an n-channel thin film transistor, P (phosphorus) ions are implanted through the plasma doping method.

In this process, regions 430 and 434 to be heavy-doped and regions 431 and 433 to be light-doped are formed. This is because the remaining silicon oxide film 315 functions as a translucent mask to shield a part of ions as implanted there.

Then, a laser light (or an intense light using a lamp) is irradiated to activate the region into which the impurity ions are implanted. Thus, a source region 430, a channel forming region 432, a drain region 434, and low-concentration impurity regions 431 and 433 are formed in a self-alignment manner.

In this embodiment, what is indicated by reference numeral 433 is a region called "LDD (light dope drain) region". (FIG. 4J)

In the case where the thickness of the dense anodic oxide film 420 is set to 2,000 Å or more, offset gate regions can be formed outside of the channel forming region 432 with that thickness.

In this embodiment, the offset gate regions are formed, but since their dimensions are small, the contribution of the offset gate regions is small, and in order to avoid complexity of the drawings, the offset gate regions are not shown in the figures.

Thereafter, a silicon oxide film, a silicon nitride film or a laminated film of those films is formed as an interlayer insulating film 440. The interlayer insulating film may be a layer made of a resin material formed on a silicon oxide film or a silicon nitride film.

Figure 4K:
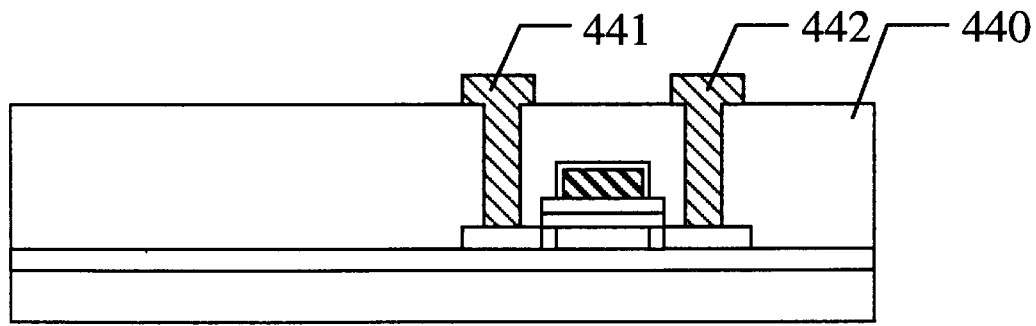
Figure 5A:
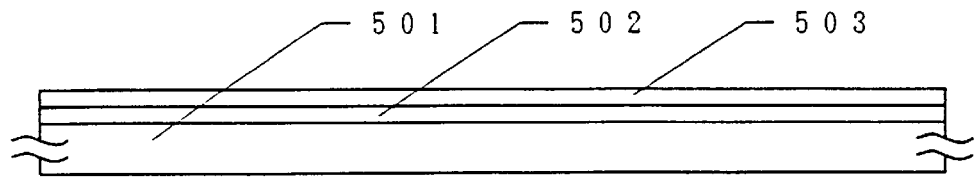
FIGS. 5A to 5C are diagrams showing a crystallizing method in a conventional example.
Figure 5B:
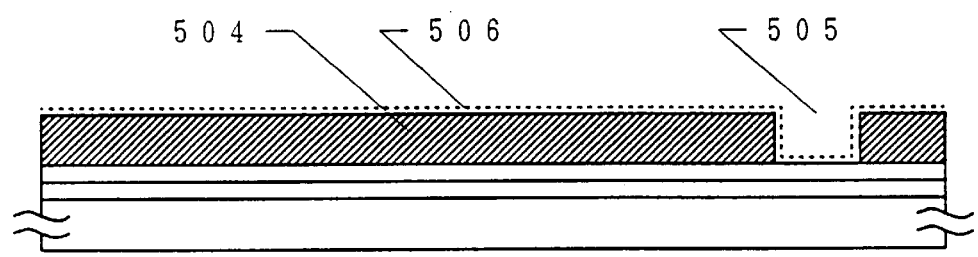
Figure 5C:
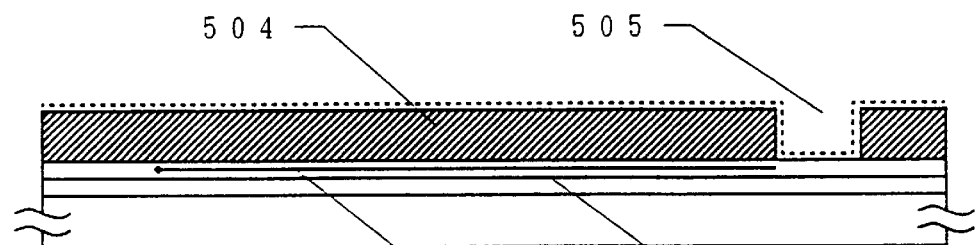

Then, contact holes are formed to form a source electrode 441 and a drain electrode 442. In this way, a thin film transistor shown in FIG. 4K is completed.

Second Embodiment

A second embodiment is directed to an example in which a hydrophobic property of the surface of an amorphous silicon film is selectively controlled so as to selectively manufacture TFTs different in crystallinity.

In other words, there is shown an example in which an oxide film is formed on a part of the amorphous silicon film to improve the wettability of that region (that is, the hydrophobic property is reduced), and a large amount of nickel elements are selectively introduced in only the region.

In general, in the case where the concentration of metal elements is increased, high crystallinity is obtained, and the movability of the TFT as obtained becomes large. However, the characteristic instability and an off-state current value become large.

Also, as a general theory, a p-channel TFT (PTFT) is stable in characteristic but small in movability. On the other hand, an n-channel TFT (NTFT) has an tendency that it is large in movability but unstable in characteristic because of the hot carrier effect.

Under the above circumstances, in this embodiment, the crystalline silicon film that forms a p-channel TFT is manufactured using metal elements with a high concentration, whereas a crystalline silicon film that forms an n-channel TFT is manufactured using metal elements with a low concentration.

FIGS. 6A to 6F show a manufacturing process according to the second embodiment. First, a silicon oxide film 602 is formed as an under film on a glass substrate 601 (or quartz substrate).

Then, an amorphous silicon film 603 is formed through the low pressure CVD method.

Thereafter, an extremely thin oxide film (not shown) is selectively formed on the entire surface, and an oxide film 604 is also selectively formed thereon. In this example, an oxide film is formed by the irradiation of UV rays in an oxidization atmosphere. The method of forming the oxide film may be a method of using an oxidation acting solution such as ozone water.

Figure 6A:
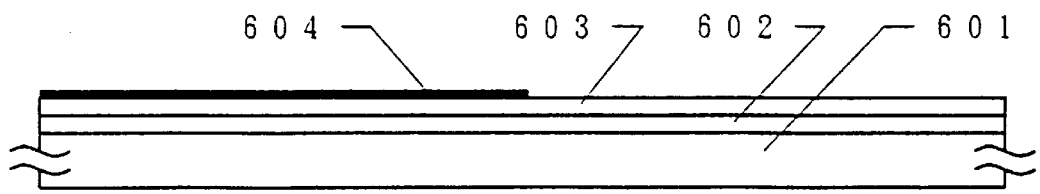
FIG. 6A to 6F are diagrams showing a process of manufacturing a thin film transistor of the second embodiment.
Figure 6B:
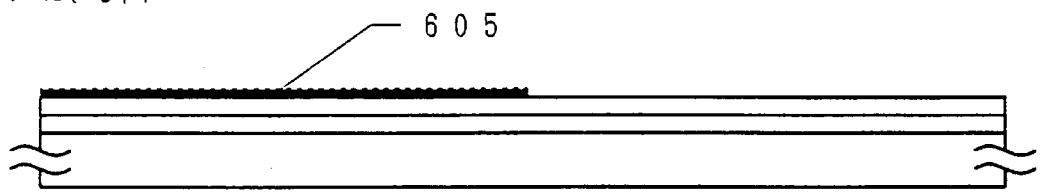

In this way, a state shown in FIG. 6A is obtained. Then, a nickel acetate solution 605 is coated on the surface. In this process, only a region where the oxide film 604 is formed is held in contact with nickel elements because the surface of the oxide film 604 is deteriorated in hydrophobic property (FIG. 6B).

On the other hand, since the nickel acetate solution is repelled by the surface of the amorphous silicon film, the nickel elements are not introduced into a region where the oxide film 604 is not formed.

Then, a heat treatment is conducted. The heat treatment is conducted at 600° C. for 4 hours in a nitrogen atmosphere.

The entire of the amorphous silicon film is crystallized in this heat treatment. In this process, first, in the region where the oxide film 604 is formed, that is, the region where the nickel elements are introduced (the nickel addition region), crystals grow vertically. On the other hand, in the region where the oxide film 604 is not formed, that is, the region where the nickel elements are not introduced (the no nickel addition region), crystals grow laterally from the nickel addition region. However, in the no nickel addition region, natural nucleation also occurs before the crystal lateral growth starts. As a result, crystals by the lateral growth and the natural nucleation are mixed in the no nickel addition region, so that the crystallinity in the nickel no addition region becomes lower than that in the nickel addition region.

Because the nickel elements exist in the nickel addition region, the crystal nucleation can be controlled. But, in the no nickel addition region, natural nucleation which cannot be controlled also occurs. Therefore, it results in the no nickel addition region having a lower crystallinity than the nickel addition region.

Figure 6C:
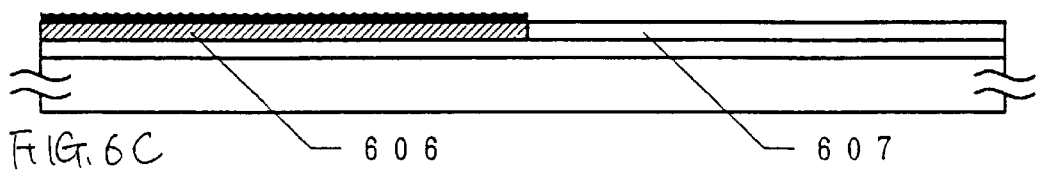

Thus, a region 606 higher in crystallinity and a region 607 lower in crystallinity are obtained (FIG. 6C).

Figure 6D:
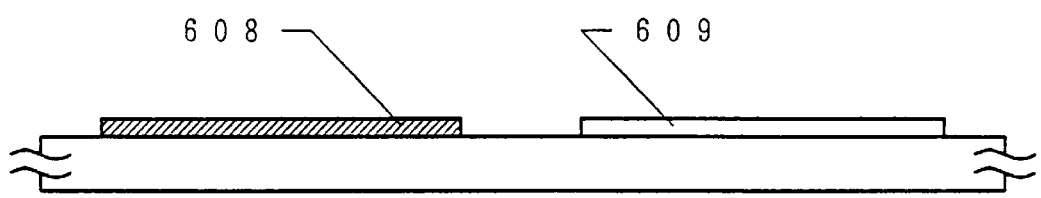

Subsequently, patterning is conducted to form regions 608 and 609. In this situation, the crystallinity of the region 608 is higher than that of the region 609. Those regions will form active layers of a TFT later (FIG. 6D).

Thereafter, a gate insulating film 600 is formed. Then, gate electrodes 610 and 612 made of aluminum are formed. Anodic oxide films 611 and 613 are formed in the periphery of the gate electrode.

Figure 6E:
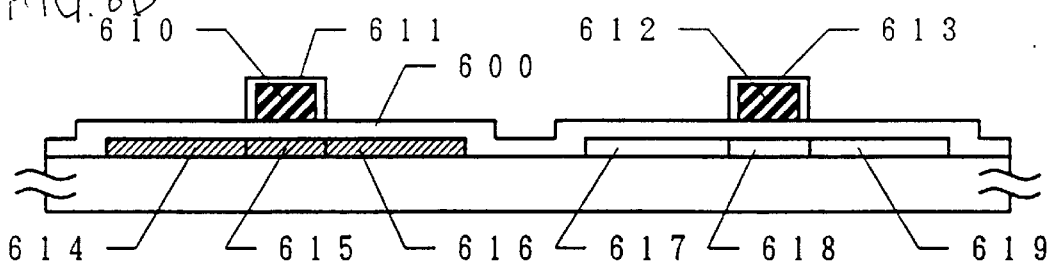
Figure 6F:
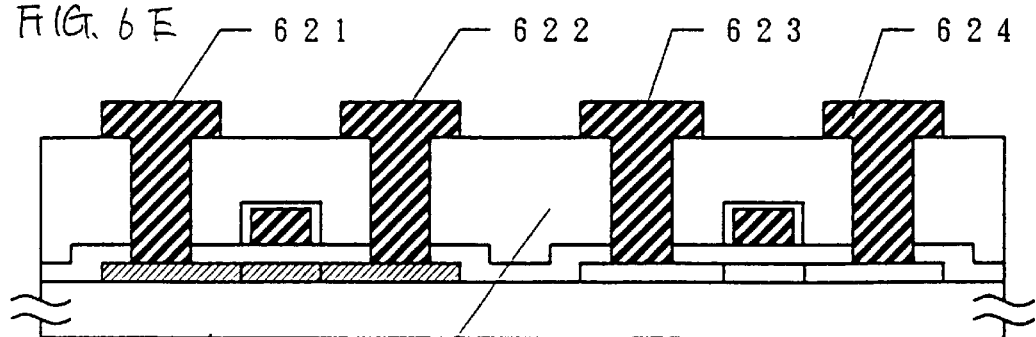

Then, doping with phosphorus and born is selectively conducted, to thereby form a source region 614, a channel forming region 615 and a drain region 616 of a PTFT in a self-alignment manner (FIG. 6E).

Simultaneously, a source region 617, a channel forming region 618 and a drain region 619 of an NTFT are formed in a self-alignment manner (FIG. 6E).

Subsequently, an interlayer insulating film 620 is formed, and contact holes are also defined to form a source electrode 621 and a drain electrode 622 of the PTFT. Also, a source electrode 623 and a drain electrode 624 of the NTFT are formed.

In this way, the PTFT and the NTFT are obtained. In this structure, the crystallinity of the active layer that forms the PTFT is higher than that of the active layer that forms the NTFT.

Accordingly, the movability of the PTFT can be relatively increased. Since the characteristics of the PTFT are more stable than those of the NTFT, even if the concentration of nickel elements becomes slightly high, there arises no problem on the whole.

On the other hand, in the NTFT, the concentration of nickel elements in the active layer is reduced so as to enhance the stability of the characteristics.

In this way, a difference in movability between the PTFT and the NTFT can be corrected so that a difference in stability therebetween can be further corrected.

As is described above, according to the present invention, using the hydrophobic property of the silicon film, when the solution containing the metal elements that promote the crystallization of silicon therein is coated, selective coating is realized, thereby being capable of conducting crystal growth in a direction parallel to the substrate. In this structure, since no mask that impedes crystal growth is formed on the upper portion of the crystal growth region, the crystal growth is not impeded, thereby being capable of obtaining the crystalline region high in quality.

Using this technique, a TFT having a high characteristic can be obtained with a high productivity and uniform characteristic.

The present invention described in this specification is applicable to not only the structure of a peripheral circuit formed together with an active matrix circuit on the same substrate in a transparent or reflection type active matrix liquid-crystal display device, but also a display device having an EL (electro luminescence) element, and a variety of circuits using a thin film transistor.

Also, the present invention described in this specification is applicable to the manufacture of a variety of integrated circuits using a thin film transistor and a device using those various integrated circuits. The device of this type may be, for example, a portable information processing terminal or a video camera.

What is claimed is:

1. A method of manufacturing a semiconductor device, said method comprising:

forming an amorphous semiconductor film on an insulating surface;

removing a part of said amorphous semiconductor film to form a metal element addition region, where a metal element is capable of promoting crystallization of said amorphous semiconductor film;

selectively introducing said metal element in contact with said metal element addition region;

heating said amorphous semiconductor film so that crystals grow in parallel to said insulating surface from said metal element addition region, wherein said selectively introducing said metal element is selectively comprises coating a solution containing the metal element therein and applying water repellence of the semiconductor film to the solution.

2. A method according to claim 1 wherein a surface of a region where crystal growth is conducted is exposed in crystal growth.

3. A method according to claim 1 wherein said metal element is Ni.

4. A method according to claim 1 wherein said metal element is at least one selected from the group consisting of Fe, Co, Ni, Ru, Rh, Pd, Os, Ir, Pt, Cu and Au.

5. A method according to claim 1 wherein said semiconductor film a silicon compound.

6. A method according to claim 5 wherein said silicon compound is a material indicated by $Si_xGe_{1-x}$ (0<x<1).

7. A method according to claim 1 wherein said semiconductor film is a silicon film.

8. A method of manufacturing a semiconductor device, said method comprising:

forming an amorphous semiconductor film on an insulating surface;

removing a part of the semiconductor film to form a metal element addition region, where a metal element is capable of promoting crystallization of the amorphous semiconductor film;

introducing the metal element in contact with the metal element addition region;

heating the amorphous semiconductor film so that crystals grow in parallel to the insulating surface from the metal element region;

forming a semiconductor island using the crystallized semiconductor film;

forming a gate electrode adjacent to the semiconductor island having a gate insulating film therebetween;

introducing an impurity into the semiconductor island to form at least a source region, a drain region, and a channel region between the source and drain regions;

wherein the metal element is selectively introduced by coating a solution containing the metal element therein and applying water repellency of the semiconductor film to the solution.

9. A method according to claim 8 wherein said metal element is Ni.

10. A method according to claim 8 wherein said metal element is one selected from the group consisting of Fe, Co, Ni, Ru, Rh, Pd, Os, Ir, Pt, Cu and Au.

11. A method according to claim 8 wherein said amorphous semiconductor film is a silicon compound.

12. A method according to claim 11 wherein said silicon compound is a material indicated by $Si_xGe_{1-x}$ (0<x<1).

13. A method according to claim 8 wherein said semiconductor film is a silicon film.

14. A method of manufacturing a semiconductor device, said method comprising:

forming an amorphous semiconductor film on an insulating surface;

removing a part of the semiconductor film to form a metal element addition region, where a metal element is capable of promoting crystallization of the amorphous semiconductor film;

introducing the metal element in direct contact with the metal element addition region; and crystallizing said amorphous semiconductor film in a parallel direction to said insulating surface from the metal addition region by heating;

forming a semiconductor island using the crystallized semiconductor film;

forming a gate electrode adjacent to the semiconductor island having a gate insulating film therebetween;

introducing an impurity into the semiconductor island to form at least a source region, a drain region, and a channel region between the source and drain regions;

forming an insulating film covering the semiconductor island and the gate electrode;

forming at least an electrode being connected to at least one of the source and drain regions through the insulating film;

wherein the metal element is selectively introduced by coating a solution containing the metal element therein and applying water repellency of the semiconductor film to the solution.

15. A method according to claim 14 wherein said metal element is at least one selected from the group consisting of Fe, Co, Ni, Ru, Rh, Pd, Os, Ir, Pt, Cu and Au.

16. A method according to claim 14 wherein said semiconductor film a silicon compound.

17. A method according to claim 16 wherein said silicon compound is a material indicated by $Si_xGe_{1-x}$ (0<x<1).

18. A method according to claim 14 wherein said semiconductor film is a silicon film.

19. A method according to claim 1 wherein said semiconductor device is an EL display device.

20. A method according to claim 8, wherein said semiconductor device is an EL display device.

21. A method according to claim 14, wherein said semiconductor device is an EL display device.

* * * * *

UNITED STATES PATENT AND TRADEMARK OFFICE
CERTIFICATE OF CORRECTION

PATENT NO.    : 6,093,587
DATED         : July 25, 2000
INVENTOR(S)   : Hisashi Ohtani It is certified that error appears in the above-identified patent and that said Letters Patent is hereby corrected as shown below:

Drawings,
Fig. 3F should be deleted to be replaced with drawing Fig. 3F, as shown below:

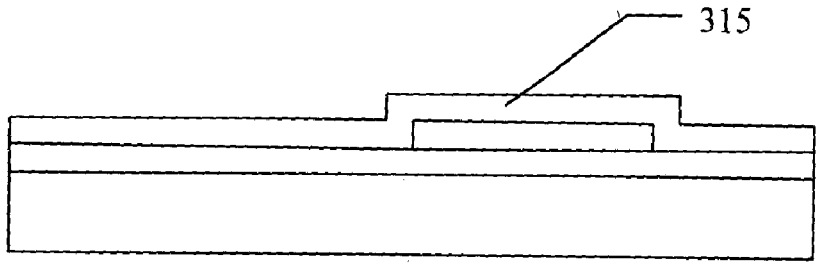

FIG. 3F

Signed and Sealed this

Eighth Day of April, 2003

JAMES E. ROGAN
*Director of the United States Patent and Trademark Office*